United States Patent [19]

Chan et al.

[11] Patent Number: 4,544,914
[45] Date of Patent: Oct. 1, 1985

[54] ASYNCHRONOUSLY CONTROLLABLE SUCCESSIVE APPROXIMATION ANALOG-TO-DIGITAL CONVERTER

[75] Inventors: Daniel F. Chan, Huntington Beach; Willard K. Bucklen, Torrance, both of Calif.

[73] Assignee: TRW Inc., Redondo Beach, Calif.

[21] Appl. No.: 487,487

[22] Filed: Apr. 22, 1983

Related U.S. Application Data

[62] Division of Ser. No. 104,166, Dec. 17, 1979, Pat. No. 4,396,905.

[51] Int. Cl.⁴ ............................................. H03K 13/02
[52] U.S. Cl. ............................ 340/347 AD; 307/269; 328/63; 340/347 M
[58] Field of Search ................ 340/347 DD, 347 AD; 328/63; 375/118; 307/247 A, 269

[56] References Cited

U.S. PATENT DOCUMENTS 4,039,960 8/1977 Clark .................................... 328/155
4,348,768 9/1982 Svala ........................ 340/347 AD X

OTHER PUBLICATIONS

The Engineering Staff of ILC Data Device Corporation, 12 Bit Hybrid A/D Converter, (ADH 8585 and 8586), (No date appears); pp. 1–5.
The Engineering Staff of Analog Devices, Inc., Analog-Digital Conversion Handbook, 6/1972, pp. II-46 to II-48; II-80 to II-83.

Primary Examiner—T. J. Sloyan
Attorney, Agent, or Firm—Noel F. Heal; Robert M. Wallace

[57] ABSTRACT

A successive approximation analog-to-digital converter controllable by signals to start and interrupt conversion asynchronously with respect to clock signals used to regulate operation of the converter. Separate control signal processing circuits register the occurrence of start-convert and conversion-interrupt signals supplied by a user of the converter, and generate corresponding control signals synchronized with the clock signals. Asynchronous operation of the converter allows it to function in a short-cycling mode, wherein the number of bits of resolution in the conversion process is automatically reduced as little as possible to complete each conversion in the time allotted by the user. A continuous-conversion signal is also provided, to permit operation on a continuous basis, without providing periodic start-convert signals.

4 Claims, 21 Drawing Figures

CLOCK

Fig. 6a $\overline{CI}$

ASYNCHRONOUSLY CONTROLLABLE SUCCESSIVE APPROXIMATION ANALOG-TO-DIGITAL CONVERTER

This is a division of application Ser. No. 104,166, filed Dec. 17, 1979, now U.S. Pat. No. 4,396,905.

BACKGROUND OF THE INVENTION

This invention relates generally to analog-to-digital converters, and, more particularly, to analog-to-digital converters of the successive approximation type. Successive approximation is a common technique employed in analog-to-digital conversion, and consists in making successive comparisons between an unknown analog input signal and a precisely generated internal voltage.

A successive approximation register in the converter is adjusted bit by bit during the conversion, and, after each one-bit trial adjustment, its contents are converted to a corresponding analog signal and compared with the unknown signal to be converted. More specifically, the successive approximation register is first cleared, the first or most significant bit is set to a one, and the corresponding analog value is compared with the analog input signal. If the analog input signal is greater than the analog signal corresponding to this first trial setting of the successive approximation register, the most significant bit is left in the set condition, but if the analog input signal is less than the analog signal corresponding to the register setting, the most significant bit is reset to zero. The process is repreated for the next most significant bit, and so forth until conversion has been effected to a desired resolution. Sequencing control logic, under the control of a clock signal and a start-convert signal, control operations on the successive approximation register.

Successive approximation analog-to-digital converters of the prior art are basically synchronous devices. Their rate of operation is determined by the number of bits of resolution required and by an additional fixed period of time required for housekeeping operations, such as clearing the successive approximation register. Moreover, the start-convert command must be given within some relatively small time frame with respect to the occurence of a clock signal, and the user of the converter must therefore time the start-convert signals accordingly if they are to be accepted by the analog-to-digital converter.

For example, in a ten-bit converter, the conversion time will probably be ten clock cycles, and the housekeeping time may be an additional clock cycle, making eleven clock cycles in all for a complete conversion. A user of such a converter would typically provide start-convert signals every eleven clock cycles, and would synchronize the start-convert signals to the clock signals using external, user-supplied circuitry. One technique for avoiding this burden on the user is to stop the clock between conversions and to start it only on receipt of the start-convert command. Although this solution is satifactory in many cases, there may be situations in which one would not wish to stop the clock between conversions. In any event, there is a further difficulty, now to be discussed, related to operation of successive approximation converters in a short-cycling mode, and stopping the clock does not provide any solution in this regard.

Short cycling is a mode of operation of successive approximation converters that is frequently made avaliable to users. The term "short cycling" refers to the premature termination of a conversion in progress in order to produce a conversion result of lower resolution, but in a shorter time, than if the conversion ran to completion using the full resolution capacity of the converter. Short cycling is usally implemented by connecting the successive approximation register outputs to output pins of the converter device, and monitoring the successive approximation register in order to determine when a particular resolution has been obtained. It will be recalled that, at each stage of conversion, a particular bit is set, and then either reset or not, depending upon the results of a comparison made between the analog equivalent of the value in the register and the analog input signal being converted. When the setting of a selected bit is observed, an interrupt signal can be fed back to the bit sequencing logic to stop the conversion prematurely.

One significant difficulty with this technique is that it may be too late to stop the conversion as desired if the inherent delay time in generating the interrupt signal is approximately equal to, or even greater than, a clock cycle time for the device. Another difficulty is that the successive approximation register must be made continuously available for monitoring, in order to generate the interrupt signal, and a separate buffered output register cannot, therefore, be conveniently employed. At high speeds of operation, the successive approximation register will contain the final converted result for only a very short time before it is cleared for the next conversion. For example, the clock cycle times contemplated for devices of the same type as the present invention are in the order of 100 nanoseconds (ns). Ideally, from a user standpoint it would be appropriate to have a buffered output register that would contain the correst converted quantity for a relatively long period, perhaps for a full conversion cycle, but to still retain the ability to provide a short-cycling mode of operation, by means of which higher conversion speeds can be attained at the expense of a lower resolution. It will be appreciated, then, that there is a significant need for an analog-to-digital converter of the successive approximation type which avoids the foregoing disadvantages. The present invention is directed to this end.

SUMMARY OF THE INVENTION

The present invention resides in an analog-to-digital converter of the successive approximation type in which both start-convert and conversion-interrupt commands can be supplied asynchronously by the user, and in which a short-cycling mode of operation may be conveniently obtained without dispensing with a buffered output register. The basic improvement in the analog-to-digital converter of the invention is a control signal processing circuit in which a control input signal, supplied asynchronously to the processing circuit, is processed to generate a control output signal completely synchronized with a clock signal.

Basically, and in general terms, the signal processing circuit of the invention comprises first storage means that can be set to a selected memory state upon the occurence of a control input signal, and second storage means responsive to the state of the first storage means and to the state of a clocking signal, wherein the second storage means is set to a selected state upon the occurence of the next clocking signal following the time that the first storage means was set to its selected state. In this manner, an asynchronous control input signal is converted to a synchronous control output signal.

The signal processing circuit of the invention is employed in two locations in the successive approximation analog-to-digital converter in order to avoid the disadvantages associated with this type of converter. First the circuit is used to process the start-convert signal, which may then be supplied completely asynchronously with respect to the clock signal. The signal processing circuit produces a synchronized start-convert signal without any requirement being imposed upon the user to synchronize the control signals. In addition, practically the same signal processing circuit is used to process a conversion interrupt signal, which then may also be completely asynchronous with respect to the clock, to generate a synchronized conversion interrupt control signal.

Although the two aforementioned applications of the processing circuit are significant improvements in themselves, their joint effect is perhaps even more significant, permitting the converter to be operated in an automatic short-cycling mode. In accordance with this aspect of the invention, a single start-convert signal line is tied both to the start-convert control input and to the inverse form of the conversion interrupt control signal. Conversion control signals can be supplied at any desired frequency or time spacing, without regard to the frequency of the clock, and conversions will be initated at the desired frequency. If the time between cycles of the control signals applied to both the start-convert and conversion interrupt signal lines is not sufficient for a full conversion, within the capacity of the converter, short cycling will occur automatically, to supply a digital result having the maximum resolution possible within the conversion time allowed between the control signals.

In accordance with a preferred form of the signal processing circuit of the invention, the first storage means comprises a pair of D-type flip-flops and the second storage means comprises at least two further D-type flip-flops. A selected logic level is transferred from the first flip-flop to the second flip-flop upon the occurrence of a control input signal, and is transferred from the second flip-flop to the flip-flops in the second storage means upon the subsequent occurence of subsequent level changes in the clock signal. The selected logic level is then propagated through successive flip-flops of the second storage means, upon each transition in clocking signal level. Any uncertainty with regard to the time of occurence of the initial control input signal is reduced to zero by the time the selected logic level has propagated to the second flip-flop of the second storage, means. When the selected logic level reaches the output of the second storage means, a reset line is activated, the reset line being connected to clear the first memory means prior to the acceptance of another control input signal. The reset line is held in an active state until such time as the circuitry controlled by the synchronized control input signal is ready to process another control input signal. For example, the reset line in the circuit used to synchronize start-convert signals is held active until completion of conversion.

In accordance with another aspect of the invention, an additional control signal line is provided to allow the converter of the invention to operate on a continuous basis, beginning a new conversion immediately upon completion of the previous one. When a continuous-convert signal line is in a selected logic state, only a single start-convert signal need be given, i.e., the control signal processing circuit becomes responsive to a start-convert level rather than a start-convert pulse, and the converter remains in the continous conversion mode until such time as the logic level of either the start-convert level or the continuous-convert level is changed.

It will be appreciated from the foregoing that the present invention represent a significant advance in the field of analog-to-digital converters of the successive approximation type. In particular, the invention provides an analog-to-digital converter of this type which may be started and interrupted using asynchronous control signals, and which readily lends itself to an automatic form of short-cycling operation. Other aspects and advantages of the invention will become apparent from the following more detailed description, taken in conjunction with the accompanying drawings.

DETAILED DESCRIPTION

Figure 3:
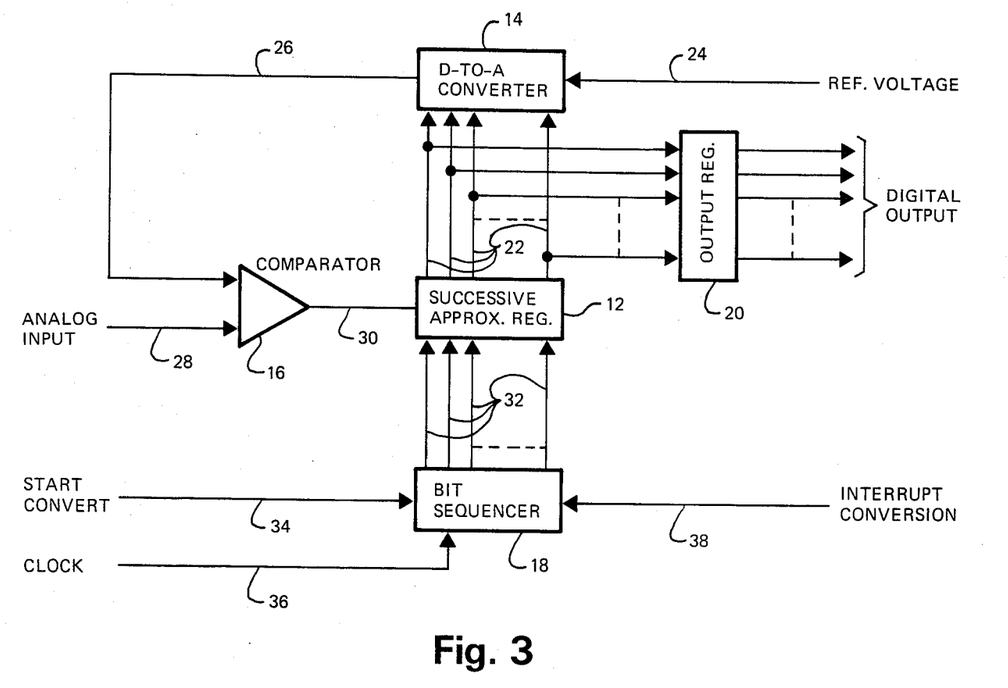
FIG. 3 is a simplified block diagram of a typical analog-to-digital converter of the successive approximation type.

As shown in the drawings for purposes of illustration, the present invention is principally concerned with improvements in analog-to-digital converters of the successive approximation type. As shown in FIG. 3, a typical analog-to-digital converter of this type includes a successive approximation register, indicated by reference numeral 12, a digital-to-analog converter 14, a comparator 16, control logic referred to as a bit sequencer 18, and preferably an output register 20.

The successive approximation register 12 has its parallel outputs connected, as shown by lines 22, to the digital-to-analog converter 14, which is also supplied with a reference voltage, as indicated at 24. The analog output of the digital-to-analog converter 14 is connected by line 26 as one input to the comparator 16, the other input being the analog input signal provided over line 28. The comparator output, on line 30, is binary in form, and indicates whether the analog input on line 28 is greater than or less than the analog value 26 derived from the successive approximation register 12. The result of this comparison, on line 30, is made available to further modify the successive approximation register 12. The entire conversion operation is controlled, as indicated by lines 32, by the bit sequencer 18, which receives start-convert signals on line 34, clock signals on line 36 and conversion interrupt signals on line 38.

In operation of the analog-to-digital converter shown in FIG. 3, the successive approximation register 12 is first cleared, and the most significant bit is set to a one. The digital-to-analog converter 14 provides, on line 26, an analog equivalent of the current value of the successive approximation register, which initially has just the first bit set. The comparator compares this analog equivalent with the analog input signal on line 28, and provides, on line 30, an indication as to whether the analog input signal is greater than or less than the analog equivalent of the first or most significant digit in the successive approximation register. If the analog input signal is greater than the converted register value, the first bit of the successive approximation register 12 is left in the set condition, but if the analog input signal is less than the converted register value, the most significant bit in the register 13 is cleared.

The process is repeated for the second most significant bit of the register 12, then the third, and so forth until the entire register has been adjusted to provide the best estimate in digital form of the analog input signal on line 28. The output register 20 provides a buffered digital output from the successive approximation register 12, which register the final digital result only at the very end of the conversion process, and only until such time as the register is again cleared for a subsequent conversion. The bit sequencer 18 includes control logic that directs the operations described, as initiated by the start-convert command on line 34 and the clock signals on line 36. The present invention is directed toward overcoming two problems related to successive approximation converters of this general type. First, in converters available prior to this invention each of the start-convert signals applied to the bit sequencer 18 on line 34 must occur practically in synchronisum with one of the clock signals on line 36 for the converter to operate properly. Similarly, the conversion interrupt signal on line 38 must also be synchronized appropriately with the clock signals on line 36. These timing considerations clearly impose significant constraints on the user of the converter. The second problem relates to operation in what is known as the short-cycling mode. In this mode of operation, the timing of the conversion interrupt signal on line 38 is usually derived, in prior systems, from an appropriate bit position of the successive approximation register 12. For this reason, the successive approximation register 12 has to be made available to the user, and the desired output register 20 must usually be omitted.

In accordance with the present invention, a signal processing circuit controls both the application of the start-convert signal on line 34 and the application of the conversion interrupt signal on line 38, resulting in asynchronous control of the converter and, as will be seen, automatic operation in a short-cycling mode when this is necessitated by timing contraints imposed by the user of the converter.

Figure 1:
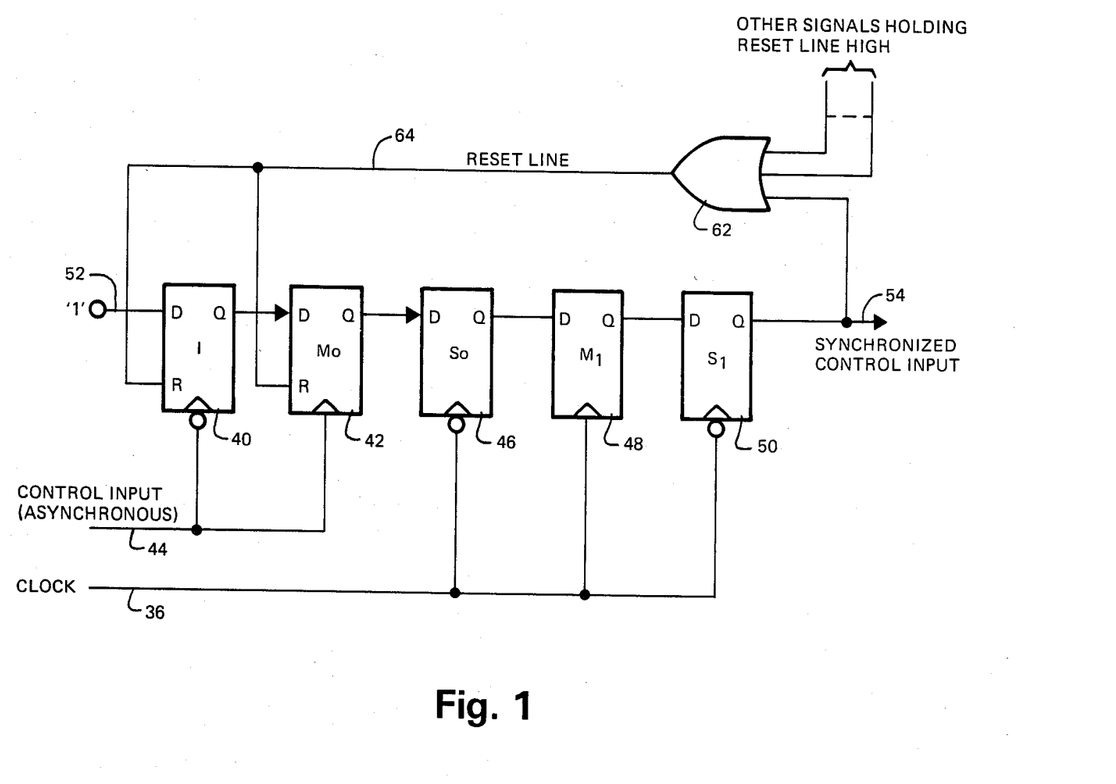
FIG. 1 is a smiplified logic diagram of a control signal processing circuit constructed in accordance with the present invention.

FIG. 1 shows the basic circuit arrangement for the signal processing circuit of the invention. It will be seen that the circuit includes two D-type flip-flops 40 and 42 clocked by a control input signal on line 44, and three further D-type flip-flops 46, 48 and 50, clocked by the clocking signals on line 36. The D terminal of the first flip-flop 40 is permanently supplied with a logical one level, as indicated at 52, and the Q output terminals of flip-flops 40, 42, 46 and 48 are connected to the D input terminals of subsequent flip-flops 42, 46, 48 and 50, respectively. The output of the last flip-flop 50 provides the synchronized control input signal on line 54. The control input signal on line 44 is inverted before application to the clock terminal of the first flip-flop 40, but is not inverted before application to the clock terminal of the second flip-flop 42. Similarly the clock signal on line 36 is inverted before application to the clock terminals of flip-flops 46 and 50, but not inverted in application to the clock terminal of flip-flop 48.

Figure 2A:
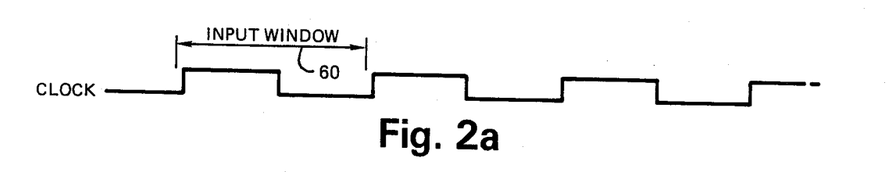
FIGS. 2a-2g are timing diagrams relating to the operation of the circuit of FIG. 1.
Figure 2B:
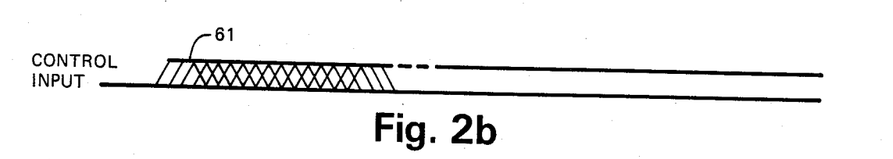
Figure 2C:
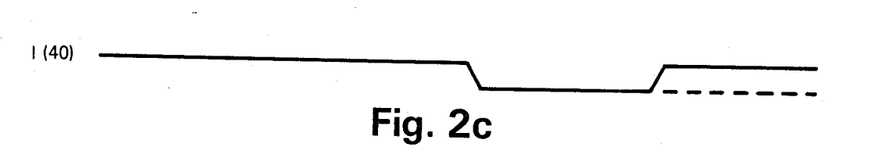
Figure 2D:
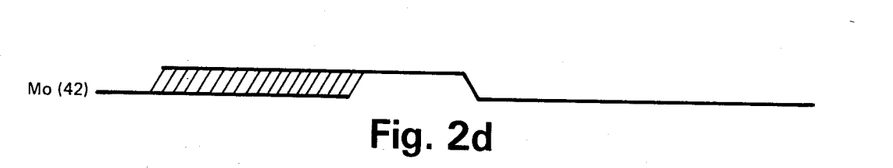
Figure 2E:
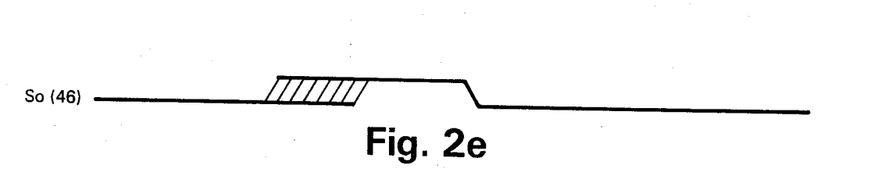
Figure 2F:
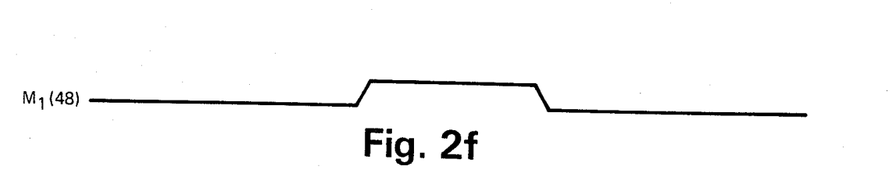
Figure 2G:
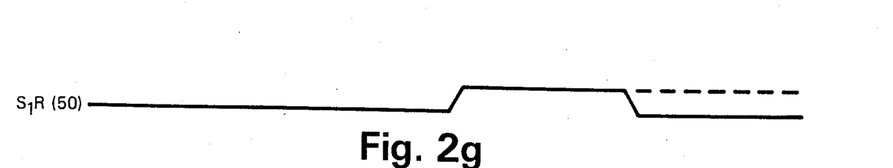

FIGS. 2a–2g illustrate the timing relationships of the signals in the circuit shown in FIG. 1. A one-cycle "input window" is indicated at 60 in FIG. 2a, and FIG. 2b shows a control input pulse 61 and a range of uncertainty, with respect to timing, that could occur with respect to this pulse over the input window range. Before the control input signal 61 goes high, its low level is inverted before application to the clock terminal of the first flip-flop 40, and the logical one input on line 52 is therefore continuously impressed on the Q output of flip-flop 40, and on the D input of flip-flop 42. When the control input signal on line 44 goes to a high level, the logical one input is thereby propagated to the second flip-flop 42, and thence to the D input of the third flip-flop 46. The third flip-flop 46 has its D input transferred to its Q output when the clock signal of FIG. 2a is at a low level. Consequently, flip-flop 46 will produce a "one" output some time during the latter part of the input window 60, and the range of uncertainty of the signal timing is thereby reduced by about half, as indicated in FIG. 2e. The logical one signal is next propagated into flip-flop 48 upon the occurence of the next rising edge of a clock signal, and finally into flip-flop 50 upon the occurence of the next falling edge of the clock signal. As will be seen from FIG. 2f, which shows the output level from flip-flop 48, the control signal pulse has no timing uncertainty at all at this stage, and is completely synchronized with the clock signal.

As well as being used as a synchronized control input signal, the output of flip-flop 50 on line 54 is fed back through an OR gate 62 to the reset terminals of the first flip-flops 40 and 42. Thus, when the logical one level has been propagated through to the last flip-flop 50, a reset signal is fed back on line 64, and the first two flip-flips 40 and 42 are reset to a zero state. This zero state also propagates through the three flip-flops 46, 48 and 50, and their outputs fall sequentially to the zero logic level. Other inputs to the OR gate 62 may operate to hold the first two flip-flops 40 and 42 in a reset condition even after the last flip-flop 50 has itself been reset. This will be the case, for example, when the synchronized control input on line 54 is employed to initiate a conversion. The other inputs to the OR gate 62 will be held high until the conversion is complete, and flip-flops 40 and 42 cannot, therefore, accept any further control input signals until the conversion is complete and the reset line 64 has been dropped to a logical zero state.

Figure 4:
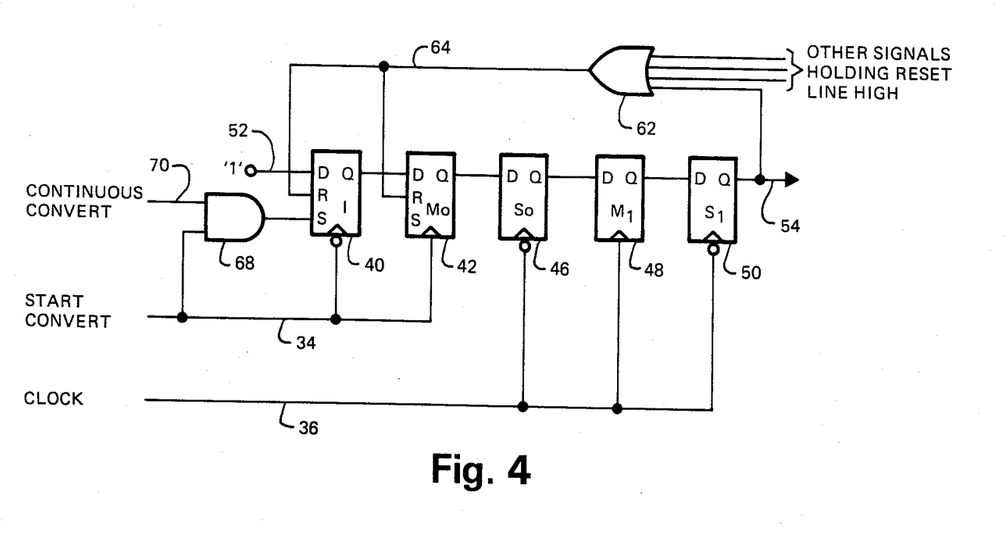
FIG. 4 is a simplified logic diagram similar to FIG. 1, but showing how the circuit is applied to the processing of start-convert commands.

FIG. 4 shows more specifically how the circuit of FIG. 1 is employed to obtain a synchronized start-convert command from an asynchronous start-convert command on line 34. The only additional element not shown in FIG. 1 but included in FIG. 4 is an AND gate 68 to which the start-convert command on line 34 is also connected as an input. The other input to AND gate 68 is a continuous-convert signal line 70. The output of AND gate 68 is connected to the set terminal of flip-flop 40. It will be apparent that, as long as the continuous-convert command on line 70 is in the logical zero state, AND gate 68 will be effectively disabled, and the circuit will function exactly as was described in relation to FIGS. 1 and 2, i.e., a start-convert pulse is required on line 34 to initiate conversion operations, but the pulse on line 34 need not be synchronized with the clock signals on line 36.

The continuous-convert signal on line 70 operates to permit use of a start-convert level rather than a start-convert pulse on line 34. If the continuous-convert signal on line 70 is held in a logical one condition, and the start-convert signal is also held in a logical one condition, the and gate 68 provides an output to the set terminal of flip-flop 40, setting this flip-flop to the logical one state. After this, a logical one is propagated through flip-flops 42, 46, 48 and 50 in much the same way as was described with respect to FIG. 2, after which a reset signal is fed back to clear flip-flops 40 and 42. Operation of flip-flop 40 is such that the reset signal overrides the set signal. Consequently, as long as the reset signal line 64 is held high, as it would be during conversion, flip-flops 40 and 42 will remain reset or cleared, and will be unable to propagate any further logical one levels through the flip-flops 46, 48 and 50. When the reset line 64 is lowered, however, the set signal applied to flip-flop 40 immediately places a logical one in this flip-flop, and the logical one signal is again propagated, upon the occurence of subsequent clock signals, through flip-flops 42, 46, 48 and 50. Thus, the next conversion operation is initiated automatically without waiting for the occurence of a start-convert pulse. In effect, the user may tie both of these signals, start-convert on line 34 and continuous-convert on line 70, to a logical one level, and the converter will make further conversions automatically without further control signals being necessary.

Figure 5:
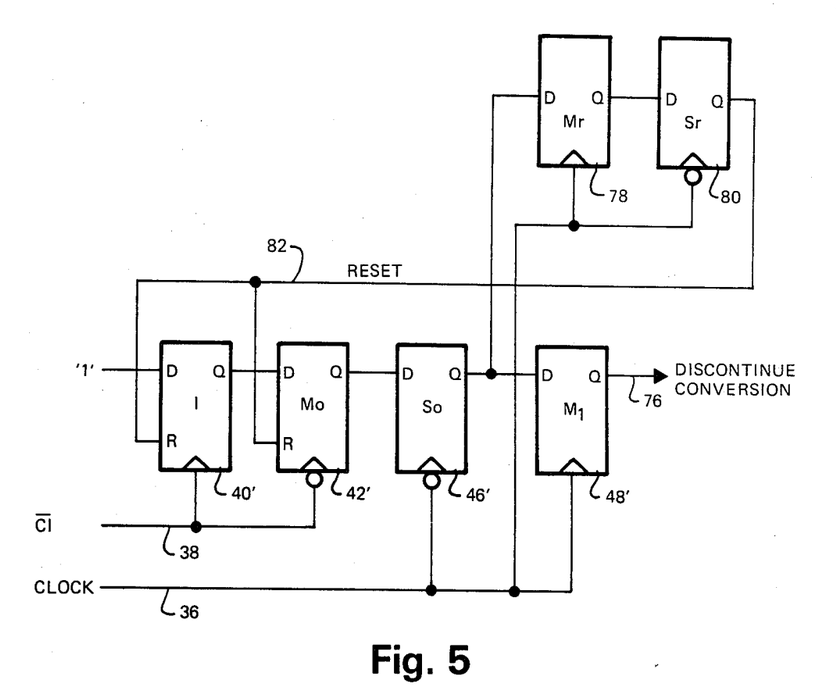
FIG. 5 is another simplified logic diagram similar to FIG. 1, but showing how the circuit is applied to the processing of conversion-interrupt commands.
Figure 6A:
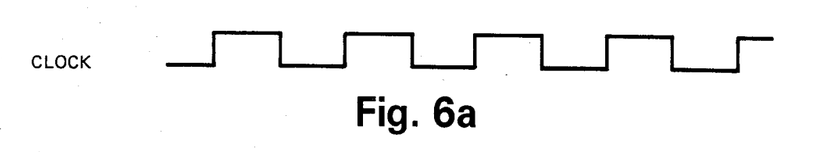
FIGS. 6a-6g are timing diagrams relating to the operation of the circuit of FIG. 5.
Figure 6B:
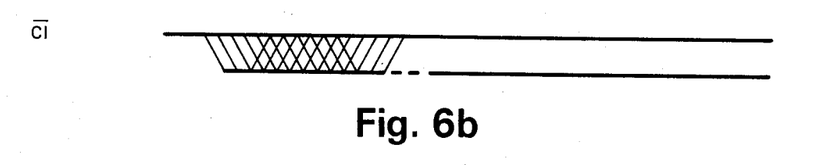
Figure 6C:
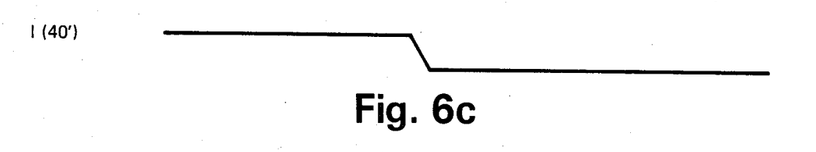
Figure 6D:
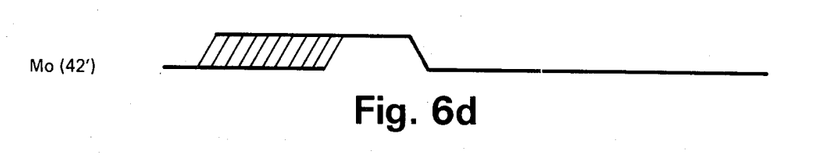
Figure 6E:
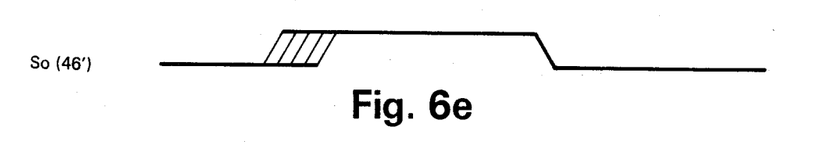
Figure 6F:
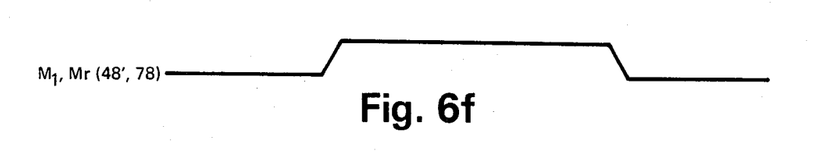
Figure 6G:
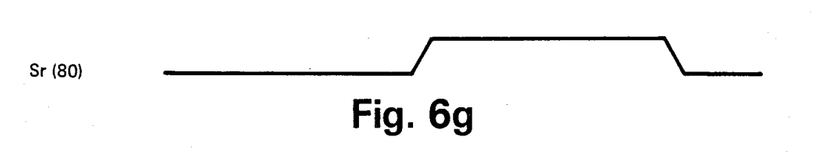

FIG. 5 shows a somewhat different arrangement of flip-flops used to process the conversion interrupt signal on line 38. In this arrangement, there are four flip-flops 40', 42', 46' and 48' connected in much the same manner as flip-flops 40, 42, 46 and 48 in FIGS. 1 and 4. The principal difference is that the conversion interrupt control signal on line 38 is applied uninverted to the first flip-flop 40', and inverted to the second flip-flop 42'. This is necessary because the inverted form of the control signal ($\overline{CI}$) is applied as a clocking signal to the first two flip-flops 40' and 42'. Thus, when the conversion interrupt singal rises, and its inverse falls, as shown in FIG. 6b, a logical one is retained in the first flip-flop 40' and is propagated to the second flip-flop 42' upon the occurence of the conversion interrupt signal, as shown in FIG. 6d. As in the other versions of processing circuit, the logical one signal is propagated to the third and fourth flip-flops 46' and 48', as shown in FIGS. 6e and 6f, respectively. The Q output of the fourth flip-flop 48', on line 76, is a synchronized control signal, and is used in the bit sequencer 18 (FIG. 7) to terminate the conversion process. Two other D-type flip-flops 78 and 80 are employed to provide an appropriate reset signal on line 82 to the reset terminals of flip-flop 40' and 42'. Flip-flop 78 derives its D input signal from the Q output of flip-flop 46'. Flip-flop 80 derives its D input signal from the Q output of flip-flop 78, and supplies its Q output signal to the reset line 82. Once the reset line 82 has been raised to a logical one, as shown in FIG. 6g, flip-flops 40' and 42' are immediately cleared, and this clearing operation is propagated through the remaining flip-flops, as shown by the falling edges of the waveforms in FIGS. 6e, 6f and 6g.

Figure 9:
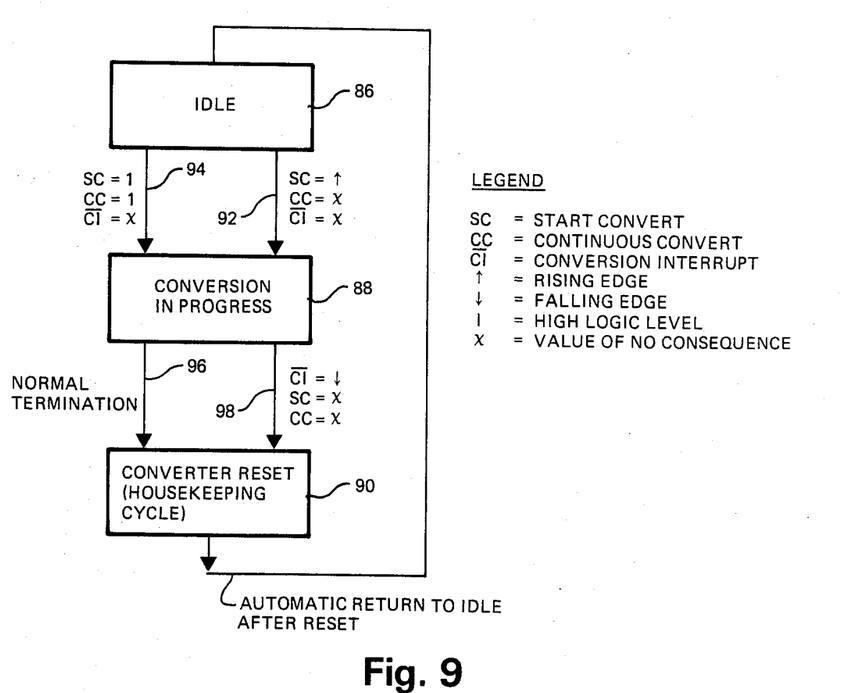
FIG. 9 is a block diagram showing the various states of operation of the analog-to-digital converter of the invention.

Now that the asynchronous nature of the control signals used in the analog-to-digital converter of the present invention is better understood, the operation of the entire device can be further described with reference to the state diagram shown in FIG. 9. It will be seen from the three blocks in the diagram that there are basically three states of operation, namely the idle state indicated by block 86, the conversion-in-progress state 88 and the converter-reset, or housekeeping state 90. When in the idle state, the successive approximation register 12 (FIG. 3) is completely cleared, the most significant bit is set, and the processing circuitry is waiting for a command. The conversion-in-progress state can be reached by one of two possible combinations of control signals. As has been described, conversion can be initiated by a rising start-convert pulse, indicated at 92, in which case the states of the continuous-convert and conversion interrupt signals are of no consequence, or by a combination of logical one levels for both the start-convert signal and the continuous-convert signal, as indicated at 94. As indicated by line 96 and 98, conversion can terminate either normally, or prematurely when the inverse conversion interrupt signal falls.

The housekeeping phase of conversion is performed at the end of the conversion process, rather than at the beginning. This provides more rapid performance, as measured by the time between a start-convert command and the availability of a converted digital result. Moreover, if the converter is used in conjunction with a sample-and-hold circuit, the held voltage from such a circuit will be converted before any significant decay or "droop" occurs.

Figure 7:
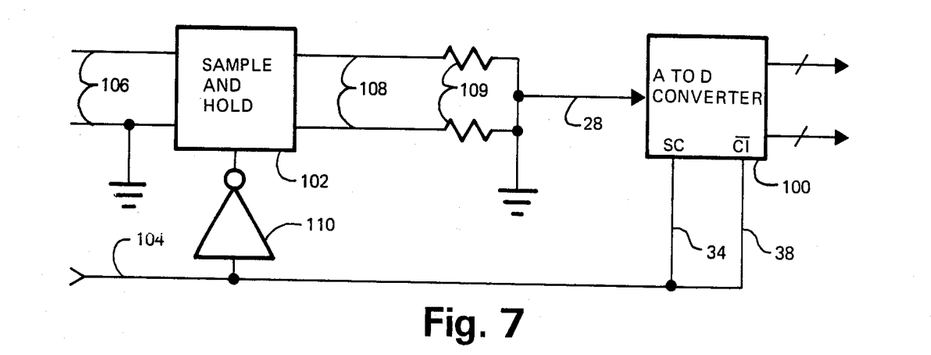
FIG. 7 is a block diagram showing how the analog-to-ditital converter of the invention may be connected for operation with a sample-and-hold circuit.
Figure 8:
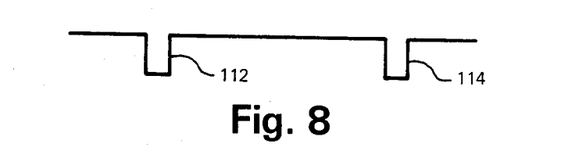
FIG. 8 shows the waveform of a conversion control signal used to control operation of the FIG. 7 circuitry.

Probably the most graphic illustration that can be given of the significance of the present invention is that provided by FIGS. 7 and 8. An analog-to-digital converter 100 is there shown connected to a sample-and-hold circuit 102, both circuits being supplied with a single convert command on line 104. The sample-and-hold circuit receives a voltage for conversion on lines 106, and supplies a held output signal on lines 108, which are connected across a voltage divider 109 to provide an appropriately scaled signal on line 28 to the analog-to-digital converter 100. The convert signal on line 104 is applied through an inverter 110 for control of the sample-and-hold circuit, the inverter 110 being necessary only to make a conversion from one type of transistor circuit logic used in the converter 100 to another type used in the sample-and-hold circuit 102. The convert signal is connected directly to both the start-convert line 34 and the inverse conversion interrupt line 38 of the converter 100. FIG. 8 shows a waveform of the convert signal on line 104. With respect to the sample-and-hold circuit 102, when the convert signal is in a low state the sample-and-hold is in a tracking mode in which its output on lines 108 is tracking the input voltage on lines 106. When the convert signal goes to a high state, the sample-and-hold 102 is placed in a hold state in which the output voltage on lines 108 is held at a constant value for analysis by the analog-to-digital converter 100.

With respect to the analog-to-digital converter 100, the convert signal on line 104 provides a conversion interrupt signal when it exhibits a falling edge and provides a start-convert signal when it exhibits a rising edge. Consequently, the analog-to-digital converter 100 will start a new conversion upon the occurrence of a rising edge, as indicated at 112, and ideally will complete the conversion before the next falling edge of the convert signal, indicated at 114, at which time an conversion interrupt signal will be generated. However, if the conversion is still in progress at the time of the falling edge 114, the conversion interrupt signal will initiate short cycling. The pulses in the convert signal waveform may be spaced at any time related distance that the user chooses, since the operation of the sample-and-hold 102 is completely asynchronous when configured in accordance with the invention. Thus, conversion will be initated as soon as possible after the detection of the start-convert signal, or rising of the convert pulse. Importantly, if the user chooses to place the convert pulses more closely together, in an attempt to obtain more conversions per second, the generation of a conversion interrupt signal will operate the converter in a short-cycling mode automatically, to provide as many bits of resolution as possible in the time that has been allotted by the user. It will be appreciated, however, that from a user standpoint, operation of the converter of the invention is extremely convenient, in that the user is almost totally relieved of any timing considerations involved in operation of the converter. It will also be appreciated that, although the specific embodiments of the invention have been described in detail for purposes of illustration, various modifications may be made without departing from the spirit and scope of the invention. Accordingly, the invention is not to be limited except as by the appended claims.

I claim:

1. For use in an analog-to-digital converter of the successive approximation type, of which the operation is regulated by clock signals, a control signal processing circuit comprising:

first storage means, for registering the occurence of an asynchronous converter control signal, said first storage means including a first pair of flip-flops switchable to a selected storage state in response to the occurence of the asynchronous converter control signal; and second storage means coupled to said first storage means, for generating a synchronous converter control signal upon the occurence of a clock signal after said first storage means has registered the occurence of an asynchronous converter control signal, said second storage means including a plurality of additional flip-flops coupled in a sequential chain to one of said first pair of flip-flops, in such a manner that each level change in the clock signal propagates a level change of the selected storage state into one or more of said flip-flops in the sequential chain;

and wherein the last of said flip-flops in the chain provides an output signal synchronized with the clock signals, and the synchronized output signal is also fed back as a reset signal, to reset said first pair of flip-flops, which results in resetting each of said flip-flops in the sequential chain in turn, from the selected storage state, and also precludes the detection of a subsequent asynchronous converter control signal until the reset signal is terminated.

2. For use in an analog-to-digital converter of the successive approximation type, of which the operation is regulated by clock signals, a control signal processing circuit comprising:

first storage means, for registering the occurence of an asynchronous converter control signal; and second storage means coupled to said first storage means, for generating a synchronous converter control signal upon the occurence of a clock signal after said first storage means has registered the occurence of an asynchronous converter control signal;

and wherein the asynchronous converter control signal is a start-convert signal, and said circuit includes resetting means for connecting the synchronous converter control signal to reset said first storage means and hold said first storage means in the reset condition unitl completion of a conversion process.

3. A control signal processing circuit as set forth in claim 2, and further including circuit means for setting said first storage means to a selected storage state upon the continuous presence of a start-convert signal and a continuous-convert signal, said first storage means being reset only by said resetting means; whereby a new synchronous converter control signal is generated automatically after a conversion is completed, provided the start-convert and continuous-convert signals are continuously present.

4. For use in an analog-to-digital converter of the successive approximation type, of which the operation is regulated by clock signals, a control signal processing circuit comprising:

first storage means, for registering the occurence of an asynchronous converter control signal; and second storage means coupled to said first storage means, for generating a synchronous converter control signal upon the occurence of a clock signal after said first storage means has registered the occurence of an asynchronous converter control signal;

wherein the asynchronous converter control signal is a conversion-interrupt signal, and said circuit further includes resetting means for generating a reset signal from the synchronous converter control signal, and applying the reset signal to said first storage means during a reset period, to permit subsequent asynchronous converter control signals to be received.

* * * * *